United States Patent
Smith et al.

(10) Patent No.: US 11,740,211 B2
(45) Date of Patent: Aug. 29, 2023

(54) LC/MS ADDUCT MITIGATION BY VAPOR DEPOSITION COATED SURFACES

(71) Applicant: Waters Technologies Corporation, Milford, MA (US)

(72) Inventors: Kerri M. Smith, Marlborough, MA (US); Paul Rainville, Princeton, MA (US)

(73) Assignee: Waters Technologies Corporation, Milford, MA (US)

( * ) Notice: Subject to any disclaimer, the term of this patent is extended or adjusted under 35 U.S.C. 154(b) by 71 days.

(21) Appl. No.: 17/150,802

(22) Filed: Jan. 15, 2021

(65) Prior Publication Data

US 2021/0239659 A1   Aug. 5, 2021

Related U.S. Application Data

(60) Provisional application No. 63/071,643, filed on Aug. 28, 2020, provisional application No. 62/968,639, filed on Jan. 31, 2020.

(51) Int. Cl.
| | |
|---|---|
| *G01N 30/72* | (2006.01) |
| *C23C 14/04* | (2006.01) |
| *C23C 14/12* | (2006.01) |
| *G01N 30/02* | (2006.01) |

(52) U.S. Cl.
CPC ........... *G01N 30/72* (2013.01); *C23C 14/046* (2013.01); *C23C 14/12* (2013.01); *G01N 2030/027* (2013.01)

(58) Field of Classification Search
CPC ........ G01N 30/72; C23C 14/046; C23C 14/12
See application file for complete search history.

(56) References Cited

U.S. PATENT DOCUMENTS

| | | | |
|---|---|---|---|
| 2008/0128606 A1* | 6/2008 | Grant | G01N 33/78 250/288 |
| 2014/0273080 A1* | 9/2014 | Apffel, Jr. | G01N 33/5005 435/40.5 |
| 2015/0024152 A1 | 1/2015 | Carr et al. | |
| 2016/0225616 A1* | 8/2016 | Li | H10B 41/00 |
| 2017/0198003 A1* | 7/2017 | Xiao | C12Y 203/01085 |
| 2018/0258529 A1* | 9/2018 | Vezza | C23C 16/24 |
| 2018/0275151 A1* | 9/2018 | Alonso Sánchez | G01N 33/92 |

(Continued)

FOREIGN PATENT DOCUMENTS

WO   2016191738 A1   12/2016

OTHER PUBLICATIONS

De Vijlder et al. "Study on the loss of nucleoside mono-, di- and triphosphates and phosphorylated peptides to a metal-free LC-MS hardware." Int. J. Mass Spectrometry. 304(2011): 83-90.

(Continued)

*Primary Examiner* — Dah-Wei D. Yuan
*Assistant Examiner* — Kristen A Dagenais
(74) *Attorney, Agent, or Firm* — Womble Bond Dickinson (US) LLP; Deborah M. Vernon

(57) ABSTRACT

The present disclosure discusses a method of separating a sample (e.g., small organic acid metabolite) including coating a flow path of a chromatographic system. The coating along the flow path is vapor deposited and prevents or severely decreases metal interactions between the metallic chromatographic system and the sample.

17 Claims, 13 Drawing Sheets

(56) References Cited

U.S. PATENT DOCUMENTS

2019/0086371 A1    3/2019  Lauber et al.

OTHER PUBLICATIONS

International Search Report and Written Opinion issued in International Application No. PCT/IB2021/050314 dated Apr. 15, 2021.
Kaluzna-Czaplinska et al. "Chromatographic techniques coupled with mass spectrometry for the determination of organic acids in the study of autism." J. Chromatogr. B. 964(2014): 128-135.

* cited by examiner

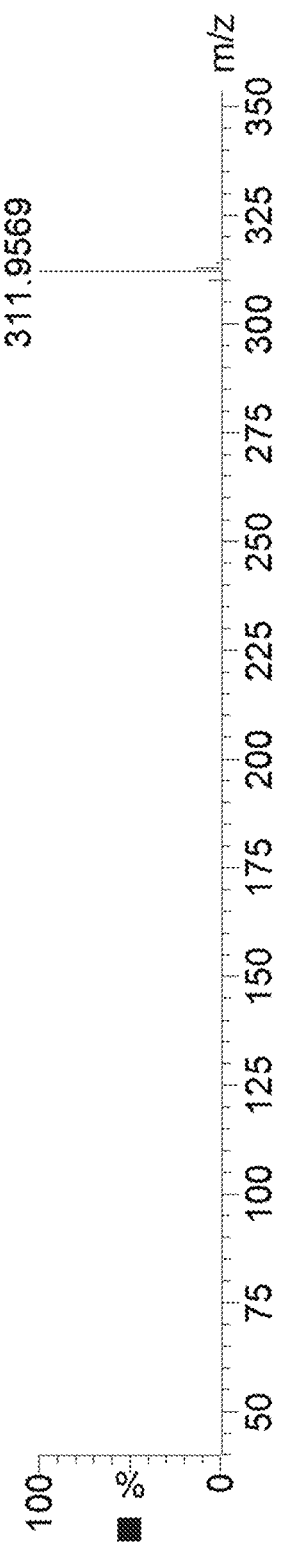
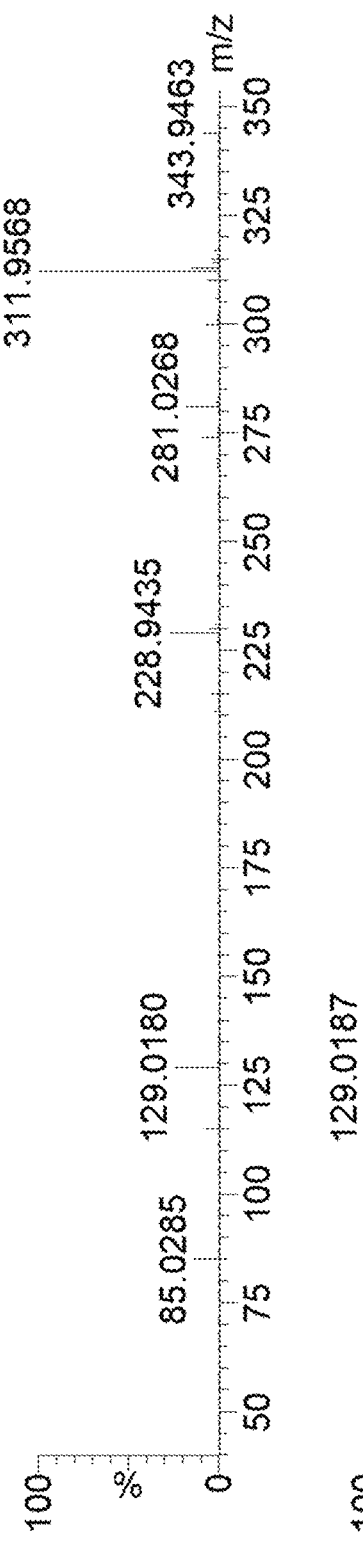
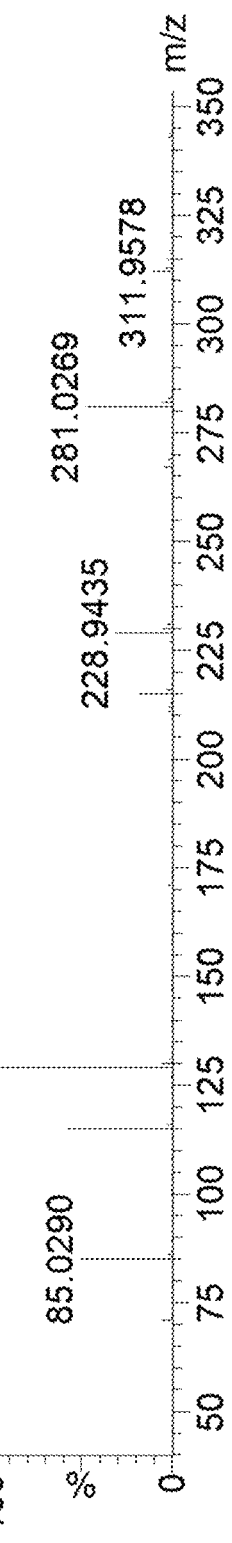
FIG. 3A Theoretical Isotope Model
FIG. 3B Standard Column Housing
FIG. 3C Coated Column Housing

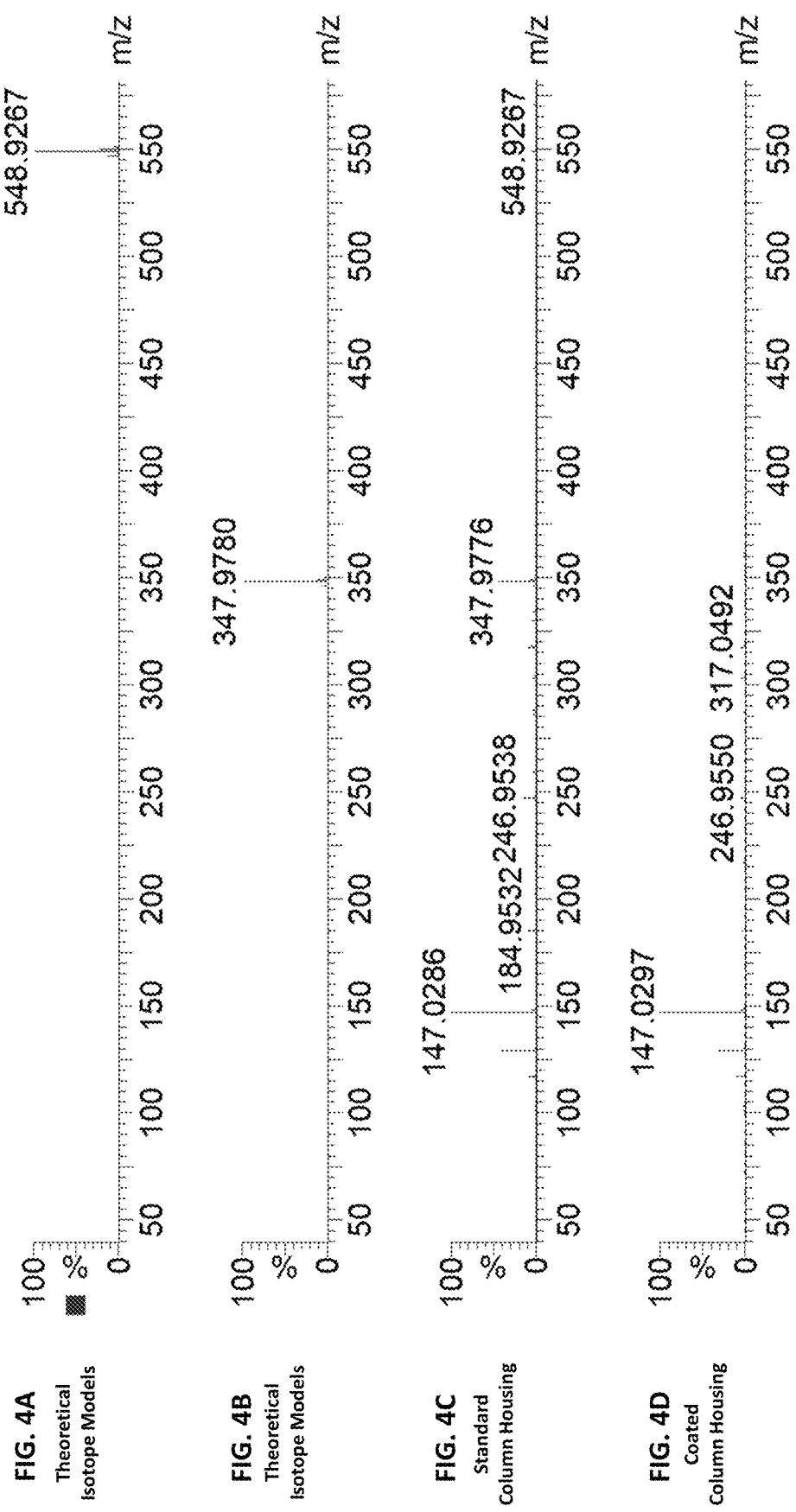
FIG. 4A Theoretical Isotope Models
FIG. 4B Theoretical Isotope Models
FIG. 4C Standard Column Housing
FIG. 4D Coated Column Housing

| Peak Number | Compound | RT, min | Theoretical mass | Structure | Peak Number | Compound | RT, min | Monoisotopic mass | Structure |
|---|---|---|---|---|---|---|---|---|---|
| 1 | Glutamine | 0.62 | 146.0691 | | 9 | Fumaric acid | 1.96 | 116.0110 | |
| 2 | Glutamic acid | 0.67 | 145.0386 | | 10 | Itaconic acid | 2.02 | 130.0266 | |
| 3 | Lactic acid | 1.1 | 90.0317 | | 11 | Pyruvic acid | 2.33 | 88.0160 | |
| 4 | Malic acid | 1.22 | 134.0215 | | 12 | 6-Phosphogluconic acid | 2.31 | 276.0246 | |
| 5 | 2-Hydroxyglutaric acid | 1.31 | 148.0372 | | 13 | α-Ketoglutaric acid | 2.56 | 146.0215 | |
| 6 | Succinic acid | 1.34 | 118.0266 | | 14 | 3-Phosphoglyceric acid | 2.48 | 185.9929 | |
| 7 | Isocitric acid | 1.47 | 192.0270 | | 15 | Phosphoenolpyruvic acid | 3.06 | 167.9824 | |
| 8 | Citric acid | 1.77 | 192.0270 | | 16 | cis-Aconitic acid | 3.46 | 174.0164 | |

FIG. 5C

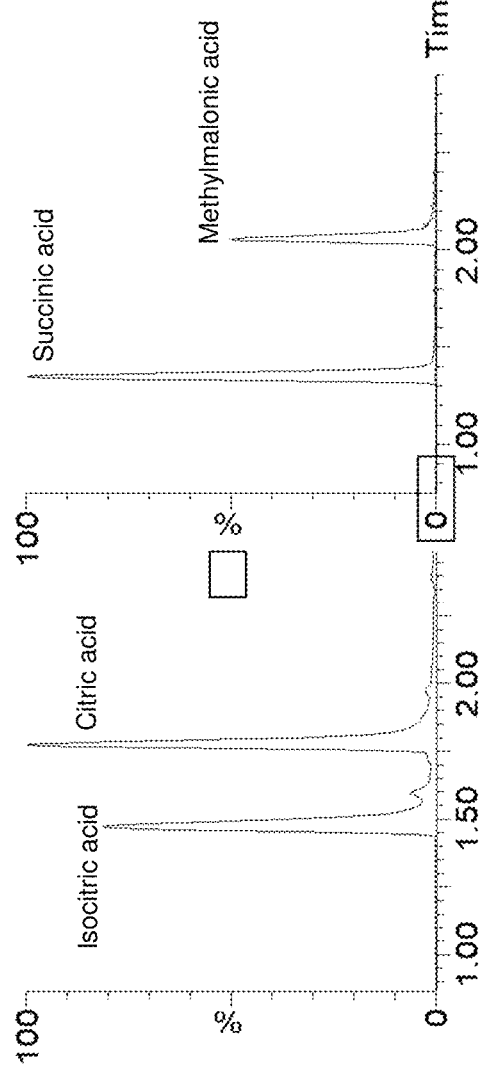
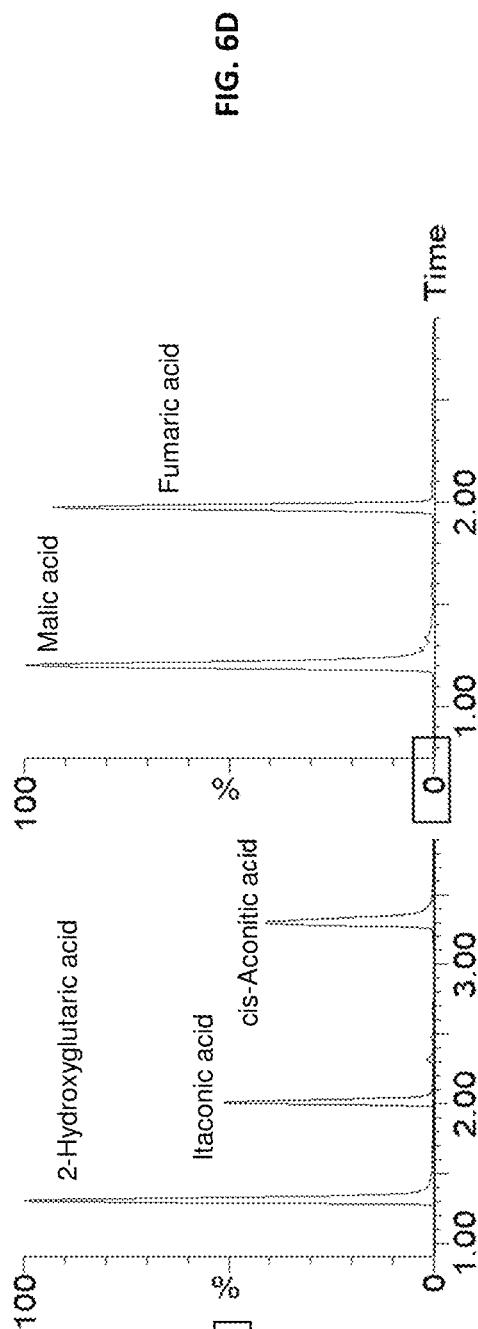
FIG. 6A  FIG. 6B  FIG. 6C  FIG. 6D

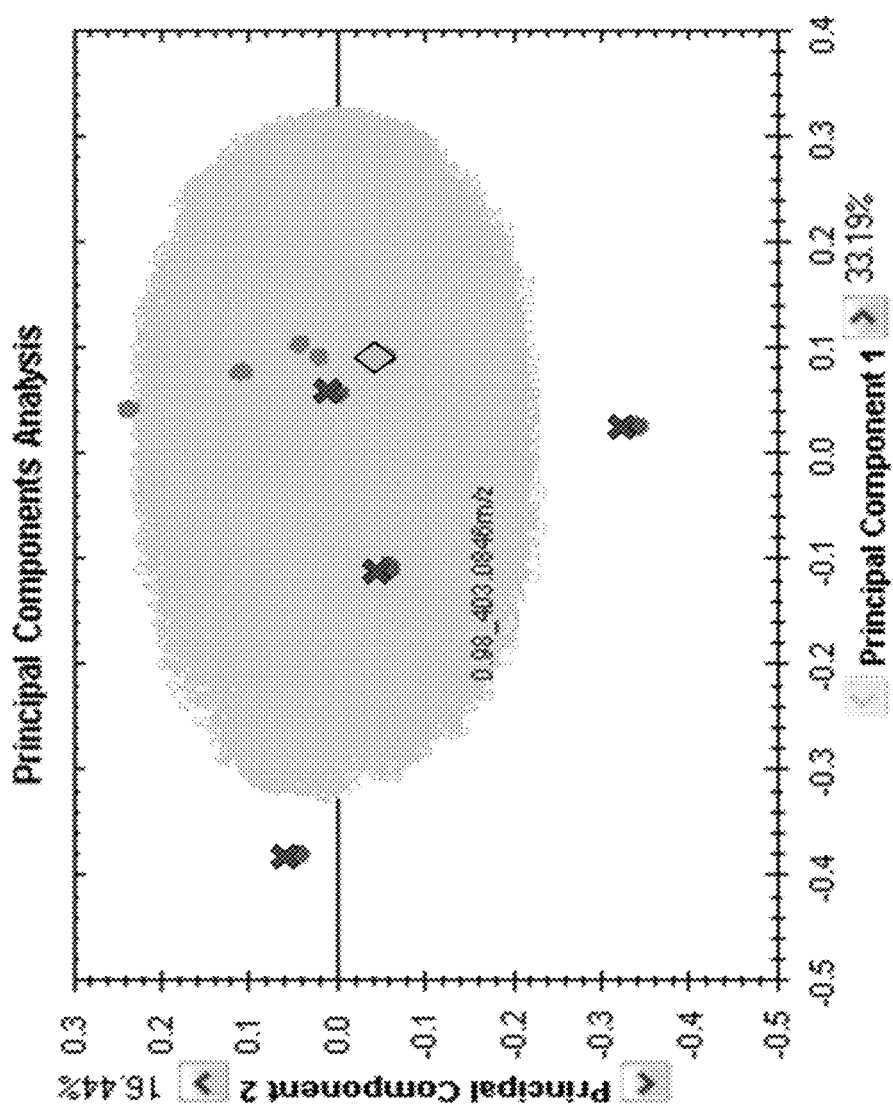
Figure 7. PCA scores plot of 5 replicate injections for each of a) Blue ● – healthy control, b) Purple X – breast cancer positive and c) Orange ◊ – QC (Pool)

LC/MS ADDUCT MITIGATION BY VAPOR DEPOSITION COATED SURFACES

CROSS-REFERENCE TO RELATED APPLICATIONS

This application claims priority to U.S. Provisional Application No. 62/968,639 filed on Jan. 31, 2020 and U.S. Provisional Application No. 63/071,643 filed on Aug. 28, 2020, the contents of each are incorporated herein by reference in its entirety.

FIELD OF THE TECHNOLOGY

The present disclosure relates to the use of vapor deposition coated flow paths for improved chromatography and sample analysis for TCA (tricarboxylic acid) cycle metabolites. More specifically, this technology relates to separating analytes in a sample using chromatographic devices having coated flow paths, methods of separating analytes in a sample (for example, TCA metabolites, such as carboxylic acids) using a fluidic system that includes coated flow paths, and methods of tailoring a fluidic flow path for separation and analysis of TCA cycle metabolites. The methods and devices of the present technology can be used to increase the selectivity, of the separation leading to improved analysis, which is extremely important in the analysis of cancer samples.

BACKGROUND

The TCA cycle is the ultimate fate of energy metabolism where Acetyl-CoA and other molecules formed by the breakdown of carbohydrates, protein, and fats undergo enzymatic oxidation to produce cofactors such as ATP to fuel cellular growth and function. Due to its central role in metabolic processes, it is quite extensively studied to help provide insights into the etiology of certain diseases. However, the small organic acid metabolites present a number of analytical challenges such as poor retention, selectivity, and often chelation with metal ions in the analytical system.

Analytes that interact with metal have often proven to be very challenging to separate. The desire to have high pressure capable chromatographic systems with minimal dispersion has required that flow paths decrease in diameter and be able to withstand increasingly high pressures at increasingly fast flow rates. As a result, the material of choice for chromatographic flow paths is often metallic in nature. This is despite the fact that characteristics of certain analytes, for example, biomolecules, proteins, glycans, peptides, oligonucleotides, pesticides, bisphosphonic acids, anionic metabolites, and zwitterions like amino acids and neurotransmitters, are known to have unfavorable interactions, so called chromatographic secondary interactions, with metallic surfaces.

The proposed mechanism for metal specific binding interactions requires an understanding of the Lewis theory of acid-base chemistry. Pure metals and metal alloys (along with their corresponding oxide layers) have terminal metal atoms that have characteristics of a Lewis acid. More simply, these metal atoms show a propensity to accept donor electrons. This propensity is even more pronounced with any surface metal ions bearing a positive charge. Analytes with sufficient Lewis base characteristics (any substance that can donate non-bonding electrons) can potentially adsorb to these sites and thus form problematic non-covalent complexes. It is these substances that are defined as metal-interacting analytes.

For example, carboxylate groups have the ability to chelate to metals. Yet, carboxylate functional groups are ubiquitous in, for example, biomolecules, giving the opportunity for cumulative polydentate-based adsorptive losses or undesirable chromatographic performance.

The metabolites from the TCA cycle are small and polar compounds containing carboxylic groups. These carboxylate groups have the ability to exhibit polydendate characteristics and chelate to metals. The analysis of these small and sometimes isomeric compounds present many analytical challenges such as obtaining sufficient retention and selectivity. Additionally, many carboxylic acids can act as metal chelators. Coupling the wide range of possible concentrations present in biomatrices, the loss of an analyte to these metal interactions and/or adducts can give a false picture of the metabolic state of that sample.

An alternative to using metal flow paths is to use flow paths constructed from polymeric materials, such as polyether ether ketone (PEEK). PEEK tubing, like most polymeric materials, is formed by means of an extrusion process. With polymeric resin, this manufacturing process can lead to highly variable internal diameters. Accordingly, PEEK column hardware yields unfavorable differences in the retention times as can be observed from switching between one column and the next. Often, this variation can be a factor of three higher than a metal constructed column. In addition, the techniques for fabricating polymer based frits are not yet sufficiently optimized to afford suitably rugged components for commercial HPLC columns. For example, commercially available PEEK frits tend to exhibit unacceptably low permeability.

Ongoing efforts to reduce chelation and secondary chromatographic interactions of analytes with metal chromatographic surfaces in an effort to facilitate chromatographic separation having higher resolutions are therefore needed. In addition, variability in the separation and detection of compounds can be caused by many factors. One such factor is analyte/surface interactions of compounds with the analytical column. Such interactions can be problematic, especially at very low concentrations of analytes.

SUMMARY

Small organic acid metabolites, such as the ones in associated with the TCA cycle, present a number of analytical challenges such as poor retention, selectivity, and often chelation with metal ions in the analytical system. To address problems experienced in separations in metallic fluidic systems, column hardware using a vapor deposited coating has been developed to define a low-binding surface(s) (LBS). Column hardware with LBS can positively impact chromatographic performance in terms of increased or proper retention, improved selectivity, and reduction of chelation/formation of metal adducts.

The present technology includes a coating, such as alkyl-silyl coating, that can provide a LBS to reduce metal interactions, increase analyte recovery, increase sensitivity, as well as reproducibility by minimizing the analyte/surface interactions that can lead to sample losses.

The present technology also includes a method for the analysis of TCA cycle metabolites using mixed-mode chromatography and specialized surfaces to decrease metal interactions.

A chromatographic column incorporating the coating of the present disclosure has been designed to minimize negative analyte/surface interactions for compounds. Analytes, such as TCA metabolites contain acidic residues in the form of carboxylate groups. In the present disclosure, metal sensitive compounds, such as citric acid, itaconic acid, and 2-hydroxyglutaric acid (all TCA metabolites) were tested with and without the coating on the column hardware.

An alkylsilyl coating on the surface area defining the flow path of a chromatographic system can minimize the interactions between the TCA metabolites and the metallic surfaces of chromatographic flow paths. Consequently, the coated metallic surfaces improve liquid chromatography separations for the small organic acid metabolites. The use of alkylsilyl coatings on metal flow paths allows the use of metal chromatographic flow paths, which are able to withstand high pressures at fast flow rates, high pressure generated using stationary phases with small particles (which can be slow flow as well), and high pressure generated from longer column beds, while minimizing the interactions between small organic acid metabolites and the metal. These components made of high-pressure material and modified with a coating can be tailored so that the internal flow paths reduce the metal interactions. The coating covers the metallic surfaces that are exposed to the fluidic path and can be deposited using vapor deposition.

In certain embodiments, the use of alkylsilyl coatings on a mixed-mode anion exchange column (e.g., phenyl-hexyl column), provided improved chromatography and MS-detection of small organic acid metabolites, such as the ones in associated with the TCA cycle.

In one aspect, the present technology is directed to a method of separating and analyzing a sample. The method includes injecting the sample into a chromatographic system having a fluid-contacting coating on a metallic surface, wherein the coating comprises an alkylsilyl, and the sample comprises one or more tricarboxylic acid cycle metabolites; flowing the injected sample through the chromatographic system; separating the flowing sample with the chromatographic system; and analyzing the separated sample with a mass spectrometer. In one embodiment, the one or more tricarboxylic acid cycle metabolites comprise a carboxylic group. In one embodiment, the one or more tricarboxylic acid cycle metabolites comprise at least one tricarboxylic acid metabolite selected from the group of citric acid, itaconic acid or 2 hydroxyglutaric acid. In one embodiment, the coating prevents tricarboxylic acid cycle metabolite interaction with metals, the coating comprising bis(trichlorosilyl)ethane or bis(trimethoxysilyl)ethane. In one embodiment, separating the sample comprises using a mixed mode anion exchange chromatographic method. In one embodiment, using a mixed mode anion exchange chromatographic method comprises using a mobile phase of water and acetonitrile each containing formic acid. In one embodiment, using a mixed mode anion exchange chromatographic method comprises using a phenyl-hexyl chromatographic column. In one embodiment, the metallic surface comprises column walls and frit surfaces, and wherein the coating on the metallic surface increases metabolite peak area relative to a non-coated metallic surface.

In another aspect, the present technology is directed to a method of increasing resolution of a sample comprising one or more tricarboxylic acid cycle metabolites when using a chromatographic system. The method includes providing the chromatographic system having a fluid-contacting coating on a metallic surface, wherein the coating comprises an alkylsilyl; injecting the sample into the chromatographic system; flowing the injected sample through the chromatographic system; separating the flowing sample with the chromatographic system; and passing the separated sample through a mass spectrometer to analyze the separated sample. In one embodiment, selecting the alkylsilyl of the coating comprises assessing polarity of the sample; selecting a desired contact angle and coating material based on the polarity assessment; and adjusting hydrophobicity of the sample flow path by vapor deposition of alkylsilyl. In one embodiment, the one or more tricarboxylic acid cycle metabolites comprise a carboxylic group. In one embodiment, the one or more tricarboxylic acid cycle metabolites comprise at least one tricarboxylic acid metabolite selected from the group of citric acid, itaconic acid or 2-hydroxyglutaric acid. In one embodiment, the metallic surface comprises column walls and frit surfaces, and wherein the coating on the metallic surface increases metabolite peak area relative to a non-coated metallic surface. In one embodiment, the coating prevents tricarboxylic acid cycle metabolite interaction with metals, the coating comprising bis(trichlorosilyl)ethane or bis(trimethoxysilyl)ethane.

In another aspect, the present technology is directed to a method of studying etiology of a disease. The method includes injecting the sample into a chromatographic system having a fluid-contacting coating on a metallic surface, wherein the coating comprises an alkylsilyl, and the sample comprises one or more tricarboxylic acid cycle metabolites; flowing the injected sample through the chromatographic system; separating the flowing sample with the chromatographic system; and analyzing the separated sample with a mass spectrometer. In one embodiment, the one or more tricarboxylic acid cycle metabolites comprise a carboxylic group. In one embodiment, the one or more tricarboxylic acid cycle metabolites comprise at least one tricarboxylic acid cycle metabolite selected from the group of citric acid, itaconic acid or 2-hydroxyglutaric acid. In one embodiment, the coating prevents tricarboxylic acid cycle metabolite interaction with metals, the coating comprising bis(trichlorosilyl)ethane or bis(trimethoxysilyl)ethane. In one embodiment, the metallic surface comprises column walls and frit surfaces, and wherein the coating on the metallic surface increases metabolite peak area relative to a non-coated metallic surface. In one embodiment, the coating covers 90% of the surfaces of the sample flow path.

BRIEF DESCRIPTION OF THE DRAWINGS

The technology will be more fully understood from the following detailed description taken in conjunction with the accompanying drawings, in which:

FIG. 3A shows a theoretical isotope model of a $ML_2$ ion. FIG. 3B and FIG. 3C show low energy spectra of itaconic acid as separated on a standard, non-coated, column (FIG. 3B) and coated column (FIG. 3C).

FIG. 4A shows a theoretical isotope model of a $M_2L_3$ ion. FIG. 4B shows a theoretical isotope model of the $ML_2$ ion. FIG. 4C and FIG. 4D show low energy spectra of 2-hydroxyglutaric acid as separated on a standard, non-coated, column (FIG. 4C) and coated column (FIG. 4D).

FIG. 5C provides a table with peak identification for FIGS. 5A and 5B.

FIG. 6A shows the separation of critical pairs isocitric and citric acid; FIG. 6B shows the separation of critical pairs methylmalonic and succinic acid; FIG. 6C shows the separation of critical pairs itaconic, 2-hydroxyglutaric, and cis-aconitic acids; and FIG. 6D shows the separation of critical pairs malic and fumaric acids.

FIG. 7 provides a PCA scores plot of 5 replicate injections for each of a healthy control (blue ●), breast cancer positive sample (purple X), and quality control, that is pooled sample (orange ◇).

DETAILED DESCRIPTION

In general, the present disclosure is related to coating columns to have low-binding surfaces (LBS) to increase analyte recovery, reproducibility and sensitivity by minimizing negative analyte/surface interactions that can lead to sample losses. The present disclosure addresses the problematic interaction of carboxylic acids with metal hardware. Many carboxylic acids act as metal chelators. Coupling the wide range of possible concentrations present in biomatrices, the loss of an analyte to these metal interactions and/or adducts can give a false picture of the metabolic state of that sample.

One method of coating for LBS is the use of alkylsilyl coatings. In some aspects, the alkylsilyl coating acts a bioinert, low-bind coating to modify a flow path to address flow path interactions with an analyte, such as a metal-sensitive analyte. That is, the bioinert, low-bind coating minimizes surface reactions with the metal interacting compounds and allows the sample to pass along a flow path without clogging, attaching to surfaces, or change in analyte properties. The reduction/elimination of these interactions is advantageous because it allows for accurate quantification and analysis of a sample containing peptide compounds or other metal-sensitive compounds. The coating which creates LBS along the flow path prevents/significantly minimizes analyte loss to the metallic surface walls, thereby reducing metal interactions.

Figure 1:
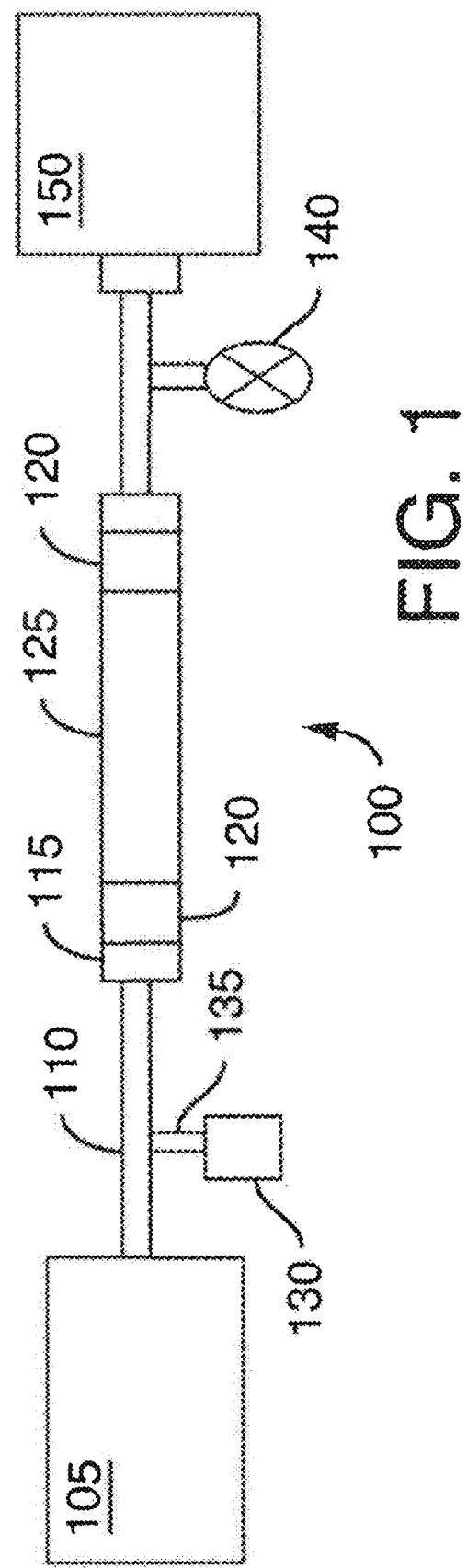
FIG. 1 is a schematic of a chromatographic flow system including a chromatography column and various other components, in accordance with an illustrative embodiment of the technology. A fluid is carried through the chromatographic flow system with a fluidic flow path extending from a fluid manager to a detector, such as a MS detector.

FIG. 1 is a representative schematic of a chromatographic flow system/device 100 that can be used to separate analytes, such as peptide compounds, in a sample. Chromatographic flow system 100 includes several components including a fluid manager system 105 (e.g., controls mobile phase flow through the system), tubing 110 (which could also be replaced or used together with micro fabricated fluid conduits), fluid connectors 115 (e.g., fluidic caps), frits 120, a chromatography column 125, a sample injector 135 including a needle (not shown) to insert or inject the sample into the mobile phase, a vial, sinker, or sample reservoir 130 for holding the sample prior to injection, a detector 150, such as a mass spectrometer, and a pressure regulator 140 for controlling pressure of the flow. Interior surfaces of the components of the chromatographic system/device form a fluidic flow path that has wetted surfaces. The fluidic flow path can have a length to diameter ratio of at least 20, at least 25, at least 30, at least 35 or at least 40.

At least a portion of the wetted surfaces can be LBS by coating with an alkylsilyl coating. The coating can be applied by vapor deposition. As such, methods and devices of the present technology provide the advantage of being able to use high pressure resistant materials (e.g., stainless steel) for the creation of the flow system, but also being able to tailor the wetted surfaces of the fluidic flow path to provide the appropriate hydrophobicity so deleterious interactions or undesirable chemical effects on the sample can be minimized. In some examples, the coating of the flow path is non-binding or non-interactive with respect to the analyte, such as a metal-sensitive compound.

The alkylsilyl coating can be provided throughout the system from the tubing or fluid conduits 110 extending from the fluid manager system 105 all the way through to the detector 150. The coatings can also be applied to portions of the fluidic fluid path (e.g., at least a portion of the fluidic path). That is, one may choose to coat one or more components or portions of a component and not the entire fluidic path. For example, the internal portions of the column 125 and its frits 120 and end caps 115 can be coated whereas the remainder of the flow path can be left unmodified. Further, removable/replaceable components can be coated. For example, the vial or sinker 130 containing the sample reservoir can be coated as well as frits 120.

In one aspect, the flow path of the fluidic systems described herein is defined at least in part by an interior surface of tubing. In another aspect, the flow path of the fluidic systems described herein is defined at least in part by an interior surface of microfabricated fluid conduits. In another aspect, the flow path of the fluidic systems described herein is defined at least in part by an interior surface of a column. In another aspect, the flow path of the fluidic systems described herein is defined at least in part by passageways through a frit. In another aspect, the flow path of the fluidic systems described herein is defined at least in part by an interior surface of a sample injection needle. In another aspect, the flow path of the fluidic systems described herein extends from the interior surface of a sample injection needle throughout the interior surface of a column. In another aspect, the flow path extends from a sample reservoir container (e.g., sinker) disposed upstream of and in fluidic communication with the interior surface of a sample injection needle throughout the fluidic system to a connector/port to a detector. That is, all tubing, connectors, frits, membranes, sample reservoirs, and fluidic passageways along this fluidic path (wetted surfaces) are coated.

In some embodiments, only the wetted surfaces of the chromatographic column and the components located upstream of the chromatographic column are LBS, coated with the alkylsilyl coatings described herein, while wetted surfaces located downstream of the column are not coated. In other embodiments, all wetted surfaces are coated, including those surfaces downstream of the column. And in certain embodiments, wetted surfaces upstream of the column, through the column, and downstream of the column to the entrance of inlet to the detector are coated. The coating can be applied to the wetted surfaces via vapor deposition. Similarly, the "wetted surfaces" of labware or other fluid processing devices may benefit from alkylsilyl coatings described herein. The "wetted surfaces" of these devices not only include the fluidic flow path, but also elements that reside within the fluidic flow path. For example, frits and/or membranes within a solid phase extraction device come in contact with fluidic samples. As a result, not only the internal walls within a solid phase extraction device, but also any frits/membranes are included within the scope of "wetted surfaces." All "wetted surfaces" or at least some portion of the "wetted surfaces" can be improved or tailored for a particular analysis or procedure by including one or more of the coatings described herein. The term "wetted surfaces" refers to all surfaces within a separation device (e.g., chromatography column, chromatography injection system, chromatography fluid handling system, frit, etc.). The term can also apply to surfaces within labware or other sample preparation devices (e.g., extraction devices) that come into contact with a fluid, especially a fluid containing an analyte of interest.

Further information regarding the coating and the deposition of coatings in accordance with the present technology is available in US 2019/0086371, which is hereby incorporated by reference. US 2019/0086371 also describes tailoring of a coating to meet the needs of a particular sample/analyte.

In some examples, coating the flow path includes uniformly distributing the coating about the flow path, such that the walls defining the flow path are entirely coated. In some embodiments, uniformly distributing the coating can provide a uniform thickness of the coating about the flow path. In general, the coating uniformly covers the wetted surfaces such that there are no "bare" or uncoated spots. The coating on the surface area defining the flow path of a chromatographic system can cover all or substantially all of the surface area. In some examples, the alkylsilyl coating can cover 90%, 95%, 96%, 97%, 98%, 99%, or 99.5% or more of the surface area exposed to fluid. The flow path can be defined as including the column walls and the frit surfaces but not including the stationary phase.

Commercially available vapor deposition coatings can be used in the disclosed systems, devices, and methods, including but not limited to Dursan® and Dursox® (commercially available from SilcoTek Corporation, Bellefonte, Pa.).

The coatings described above can be used to create LBS and can tailor a fluidic flow path of a chromatography system for the separation of a sample. The coatings can be vapor deposited. In general, the deposited coatings can be used to adjust the hydrophobicity of internal surfaces of the fluidic flow path that come into contact with a fluid (i.e. wetted surfaces or surfaces coming into contact with the mobile phase and/or sample/analyte). By coating wetted surfaces of one or more components of a flow path within a chromatography system, a user can tailor the wetted surfaces to provide a desired interaction (i.e., a lack of interaction) between the flow path and fluids therein (including any sample, such as a sample containing biomolecules, within the fluid).

The TCA cycle is an important process in carbon metabolism. It reduces cofactors for enzymatic reactions and creates precursors for biosynthetic pathways such as amino acid, protein, fatty acid, cholesterol, and nucleotide synthesis. It lies in the center of anabolic and catabolic flux and the measurement of its constituents can give insights into mechanism of certain diseases. The metabolites from the TCA cycle are small and polar compounds containing carboxylic groups (e.g., citric acid, itaconic acid and 2-hydroxyglutaric acid). The analysis of these small and sometimes isomeric compounds present many analytical challenges such as obtaining sufficient retention and selectivity. Additionally, many carboxylic acids act as metal chelators. Coupling the wide range of possible concentrations present in biomatrices, the loss of an analyte to these metal interactions and/or adducts can give a false picture of the metabolic state of that sample. To address retention and selectivity, the present technology utilizes a mixed mode anion exchange chromatographic method using a simple mobile phase of water and acetonitrile each containing formic acid. To address sensitivity to metals, the mixed mode sorbent was packed into specialized column tubing, which prevents analyte interaction with metals. In embodiments, the specialized column tubing and associated hardware includes a alkylsilyl coating on wetted surfaces to prevent analyte interaction with metals.

The new analytical method provides superior peak shape and analyte recovery, while offering improved MS quality. The analyte peak area for known metal chelator citric acid increased 3.3×, while peak asymmetry at 10% decreased from 1.99 to 1.55 using the specialized column surface. Resolution at 10% height of the critical pairs isocitric acid and citric acid increased 24% from 2.36 to 3.10. Overall, peak areas increased from 1.2-4.2× for the compounds studied.

Methods and Examples

Standard Sample Methods

Standard samples were prepared at 100 μM in aqueous solution for analysis. The samples were separated on an ACQUITY I-Class LC with an ACQUITY UPLC CSH Phenyl-Hexyl column using a shallow gradient of 0.1% formic acid in water and ACN. The LC was connected to a Xevo TQ-Smicro tandem mass spectrometer. The data was acquired and processed using MassLynx v4.2.

Fe-analyte speciation was performed by incubation of 10 mM analyte with 1 mM $Fe_2(SO)_3$ resulting in a 1:5 molar ratio of Fe:analyte. The individual solutions, in unbuffered water, were diluted 1:10 v/v with water and incubated at room temperature for 12 hours before direct analysis by the mass spectrometer.

Methods:
Xevo G2-XS Q TOF
  ESI Negative
  Temp—500 C
  Desolvation—1000 L/hr
  Source Temp—120 C
ACQUITY I-Class LC
  CSH Phenyl-Hexyl 2.1×100 mm, 1.7 um Column
    Standard and coated
  Mobile Phase A—0.1% formic acid in $H_2O$
  Mobile Phase A—0.1% formic acid in ACN Column Temp—50 C
Injection Volume—3 uL
Samples are 100 uM analytes in $H_2O$
Silanized vials were used

| [Gradient Table] | | | | |
|---|---|---|---|---|
| Time(min) | Flow Rate | % A | % B | Curve |
| 1. Initial | 0.400 | 100.0 | 0 | Initial |
| 2. 4.00 | 0.400 | 85.0 | 25.0 | 6 |
| 4. 7.00 | 0.400 | 5.0 | 95.0 | 6 |
| 5. 8.00 | 0.400 | 5.0 | 95.0 | 6 |
| 6. 8.01 | 0.400 | 100.0 | 0 | 6 |

Comparative Examples for Standard Samples

Using the methods described above, each of citric acid, itaconic acid and 2-hydroxyglutaric acid were separated in systems using uncoated hardware and hardware coated in accordance with the present technology. In each of the examples, the comparative spectra demonstrate that the Fe adducts are greatly reduced.

Figure 2B:
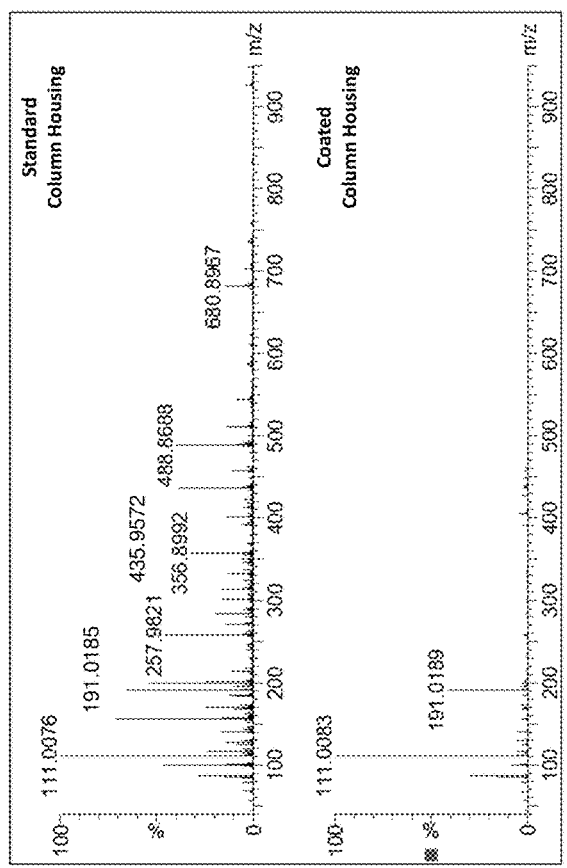
FIG. 2A and FIG. 2B show low energy (FIG. 2A) and high energy (FIG. 2B) spectra of citric acid as separated on a standard, non-coated, column (top) and coated column (bottom).
Figure 2A:
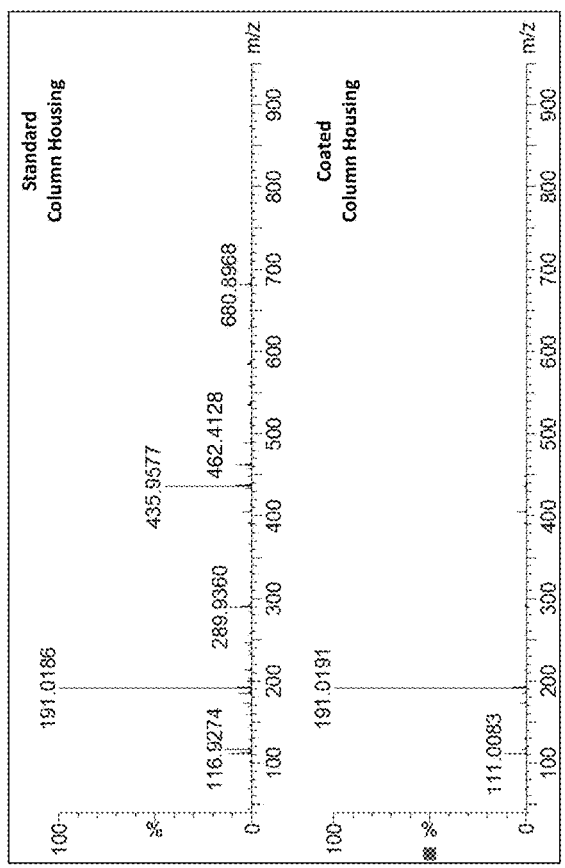
Figure 2C:
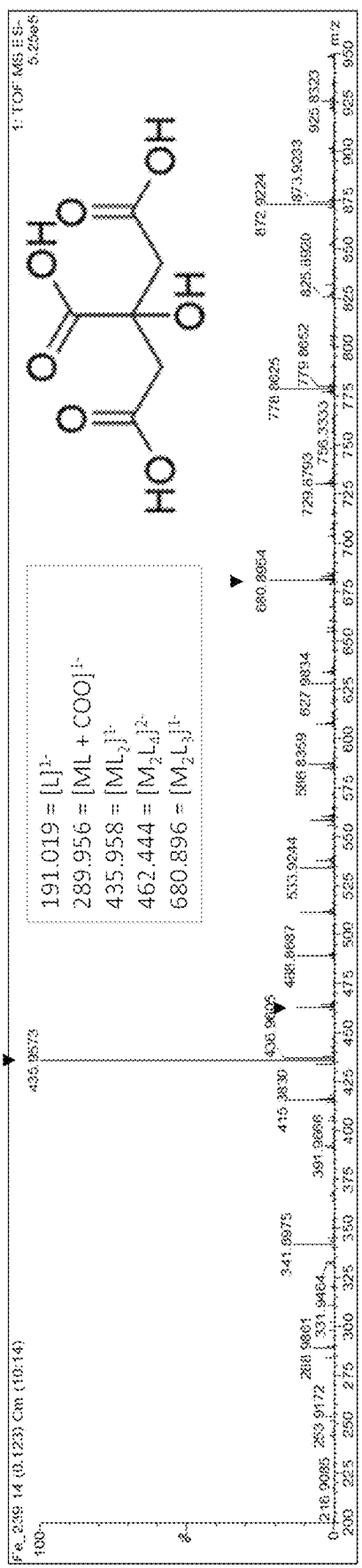
FIG. 2C provides Fe-Citrate speciation (FIG. 2A, FIG. 2B, and FIG. 2C are collectively referred to as FIG. 2).

In FIG. 2, both low energy spectra (spectra FIG. 2A) and high energy spectra (spectra FIG. 2B) are presented for citric acid. Standard column (i.e., uncoated columns and system tubing etc.) results are shown on top and coated columns results (i.e., columns and systems coated in accordance with the present technology) are shown directly below. It should be noted that the only difference between standard columns and coated columns is the presence of the coating. The results demonstrate that the Fe adducts (e.g., 435.958 m/z, 462.413 m/z, and 680.897 m/z) are greatly reduced and spectral quality increases with use of the coated column.

Figure 3D:
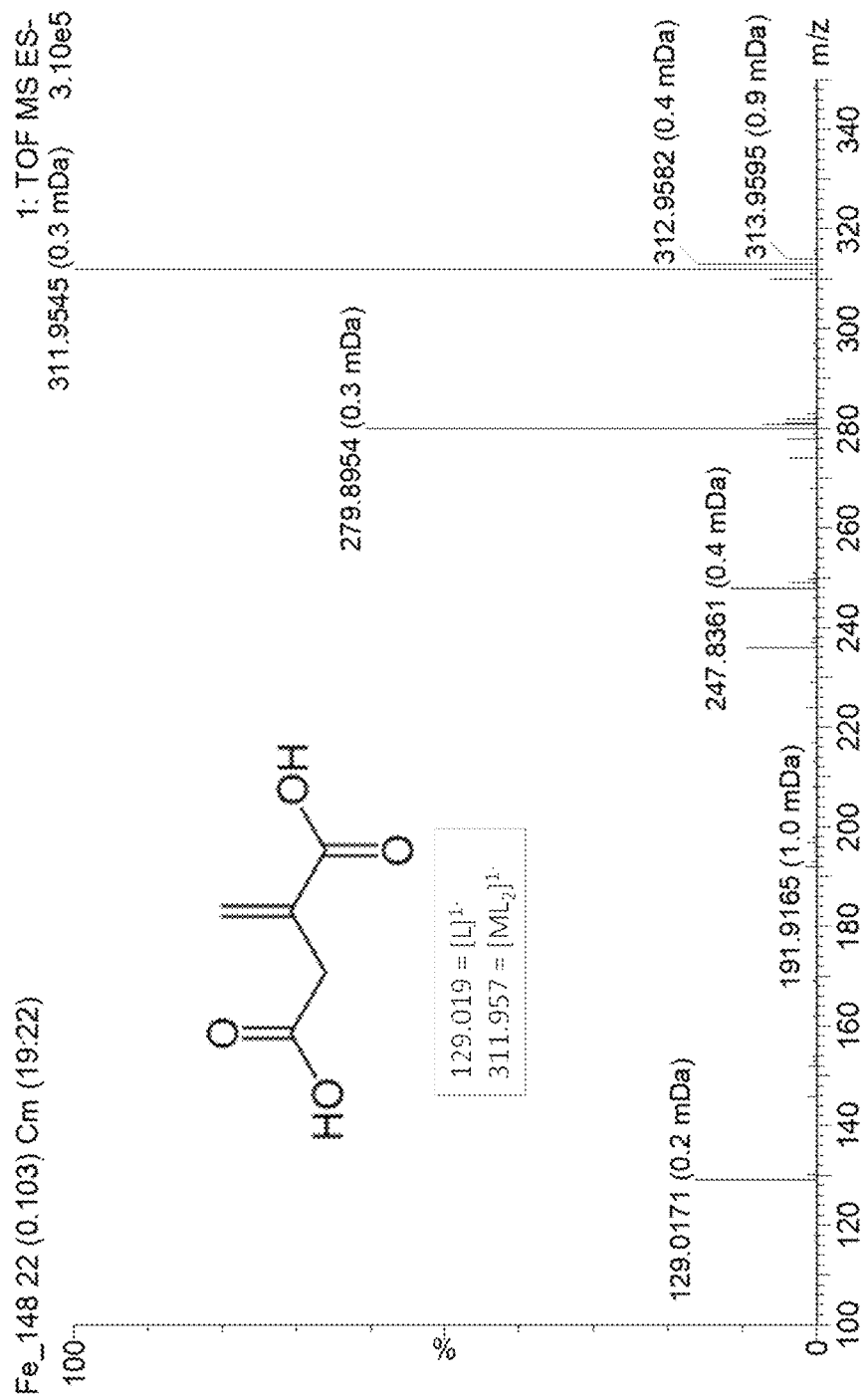
FIG. 3D shows the Fe-Itaconate speciation (FIG. 3A, FIG. 3B, FIG. 3C and FIG. 3D are collectively referred to as FIG. 3).

In FIG. 3, low energy spectra are presented for itaconic acid. Standard column (i.e., uncoated columns and system tubing etc.) results are shown in the spectra of FIG. 3B, whereas coated column results are shown in the spectra of FIG. 3C. A theoretical isotope model of the $ML_2$ ion (311.957=$[ML_2]^{1-}$ is shown in the spectra of FIG. 3A. The results demonstrate that the Fe adducts e.g., 311.95 m/z) are greatly reduced with use of the coated column.

Figure 4E:
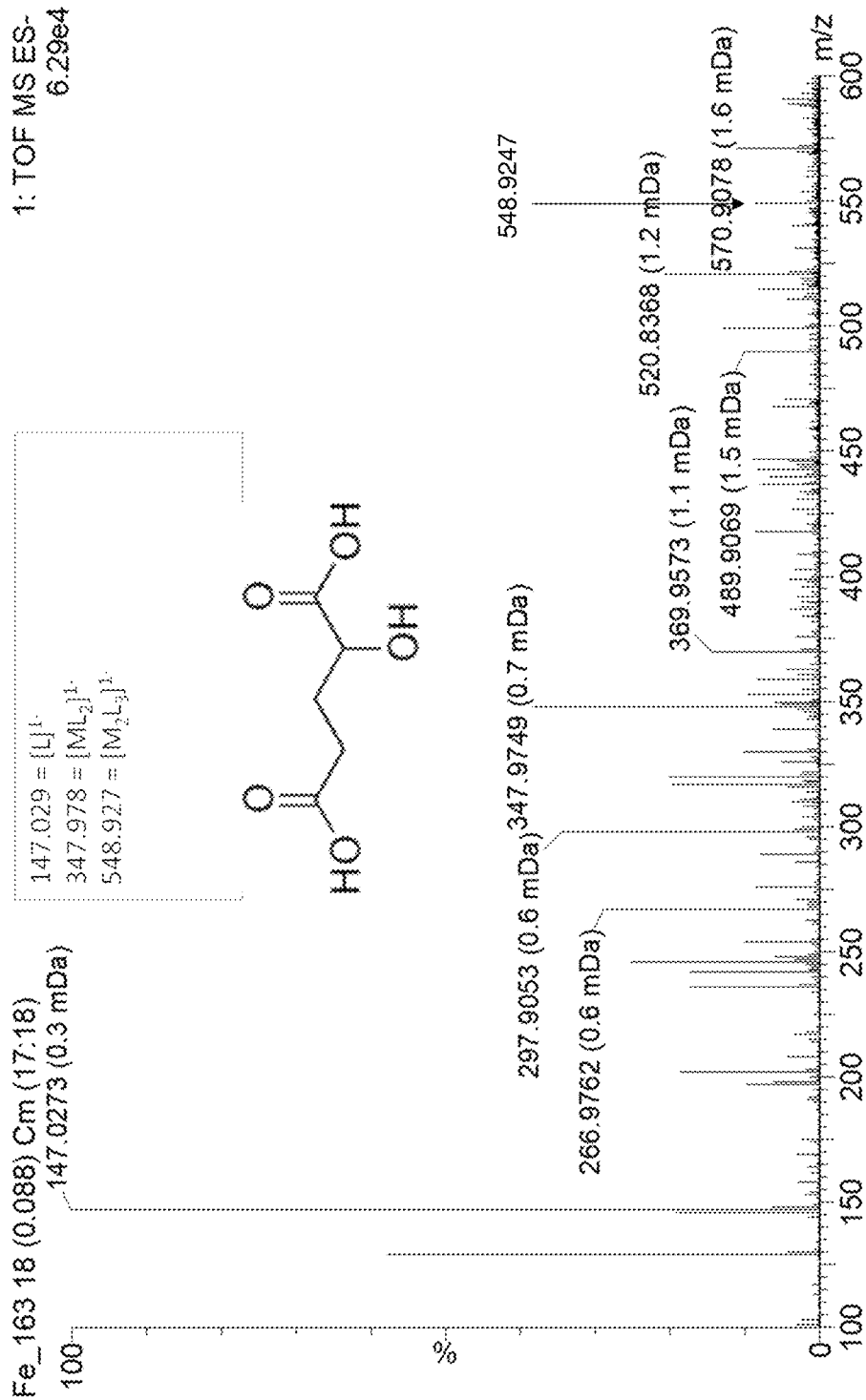
FIG. 4E displays Fe-2-Hydroxyglutarate speciation (FIG. 4A, FIG. 4B, FIG. 4C, FIG. 4D, and FIG. 4E are collectively referred to as FIG. 4).

In FIG. 4, low energy spectra are presented for 2-hydroxyglutaric acid. Standard column (i.e., uncoated columns and system tubing etc.) results are shown in the spectra of FIG. 4C, whereas coated column results are shown in the spectra of FIG. 4D. A theoretical isotope model of the $ML_2$ ion (347.978=$[ML_2]^{1-}$ is shown in the spectra of FIG. 4B; whereas a theoretical isotope model of the $M_2L_3$ ion (548.927=$[M_2L_3]^{1-}$ is shown in the spectra of FIG. 4A. The results demonstrate that Fe adducts (e.g., 347.978 m/z and 548.927 m/z) are greatly reduced with use of the coated column.

Pooled and Comparative Sample Methods

Stock solutions of the analytes were prepared in ultrapure water at 50 mM, free acid. Stock solutions were prepared by pipetting 50 μL of each analyte followed by dilution with ultrapure water in a silanized sample vial to give final concentrations of 2.5 mM/analyte. Samples were stored at 4° C. Analytes were purchased from Sigma Aldrich (3-phosphoglyceric acid, 6-phosphogluconic acid, cis-aconitic acid, citric acid, fumaric acid, glutamic acid, glutamine, isocitric acid, itaconic acid, latic acid, malic acid, phosphoenolpyruvic acid and pyruvic acid. D-α-Hydroxyglutaric acid (2-hydroxyglutaric acid) analyte was purchased from Cayman Chemical.

Urine samples were defrosted on ice followed by 3× dilution with ultrapure water. The samples were then centrifuged for 10 minutes at 4° C. and 21,130 rcf. The supernatant was transferred to a silanized vial for analysis with 50 microliters of each breast cancer positive (BioIVT, Westbury, N.Y.) and control urine sample added to a new vial for the experimental pool. Samples were analyzed immediately.

The samples were separated on an ACQUITY I-Class PLUS FTN binary chromatographic system with an ACQUITY PREMIER CSH Phenyl-Hexyl column (coated column) using a shallow gradient of 0.1% formic acid in water and ACN. The LC was connected to a Xevo G2-XS TOF mass spectrometer. The data was acquired and processed using MassLynx v4.2.

Methods:
Xevo G2-XS Q TOF
  ESI Negative
  Temp—500 C
  Desolvation—1000 L/hr
  Source Temp—120 C
  Cone voltage 10V
  Capillary 2 kV
  Collision energy for low energy set to 6
  Collision energy for high energy set to 10-40
ACQUITY I-Class LC
  CSH Phenyl-Hexyl 2.1×100 mm, 1.7 um Column Coated (PREMIER)
  Mobile Phase A—0.1% formic acid in $H_2O$
  Mobile Phase A—0.1% formic acid in ACN
  Column Temp—50 C
  Injection Volume—3 μL
Samples are 100 uM analytes in $H_2O$
  Silanized vials were used

| [Gradient Table] | | | | |
|---|---|---|---|---|
| Time(min) | Flow Rate | % A | % B | Curve |
| 1. Initial | 0.400 | 100 | 0 | Initial |
| 2. 4.00 | 0.400 | 85.0 | 25.0 | 6 |
| 4. 7.00 | 0.400 | 5.0 | 95.0 | 6 |
| 5. 8.00 | 0.400 | 5.0 | 95.0 | 6 |
| 6. 10.00 | 0.400 | 100 | 0 | 6 |

Examples for Pooled and Comparative Samples

Using the methods described above, each of the analytes (3-phosphoglyceric acid, 6-phosphogluconic acid, cis-aconitic acid, citric acid, fumaric acid, glutamic acid, glutamine, isocitric acid, itaconic acid, latic acid, malic acid, phosphoenolpyruvic acid, pyruvic acid, and 2-hydroxyglutaric acid) were separated in systems using hardware coated in accordance with the present technology. In each of the examples, the data demonstrates that the Fe adducts are inconsequential, allowing for improved separation, detection, and analysis of the analytes in the urine samples.

Figures 5A, 5B:
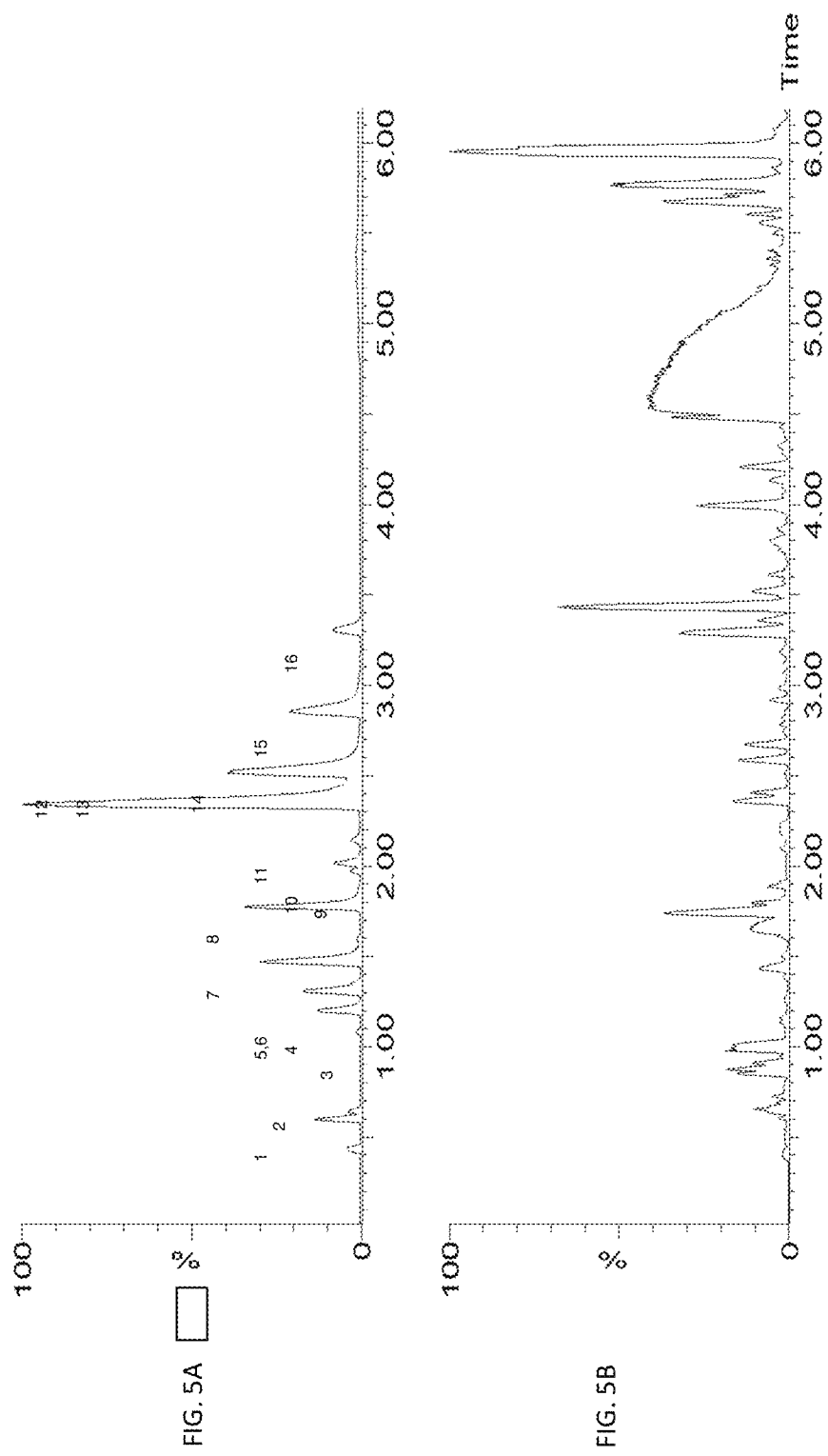
FIG. 5A shows separation chromatogram of urinary metabolites in a standard mixture on a coated, charged surface phenyl-hexyl column in accordance with the technology.
FIG. 5B shows separation chromatogram of the urinary metabolites in a pooled urine sample.
Figure 8C:
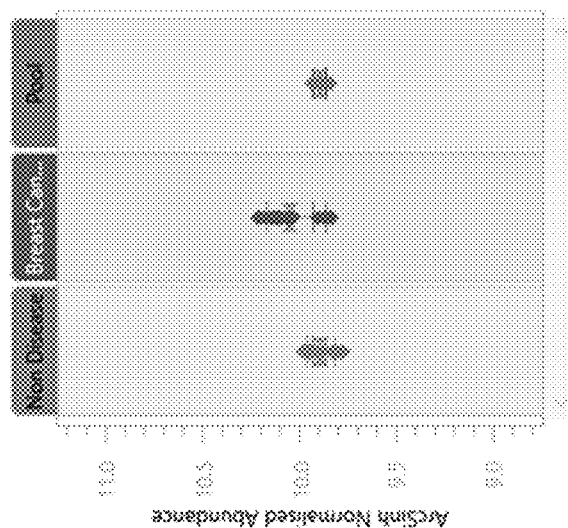
FIG. 8C is an abundance plot of isocitric acid comparing healthy urine sample, breast cancer positive urine sample, and pooled urine sample.
Figure 8B:
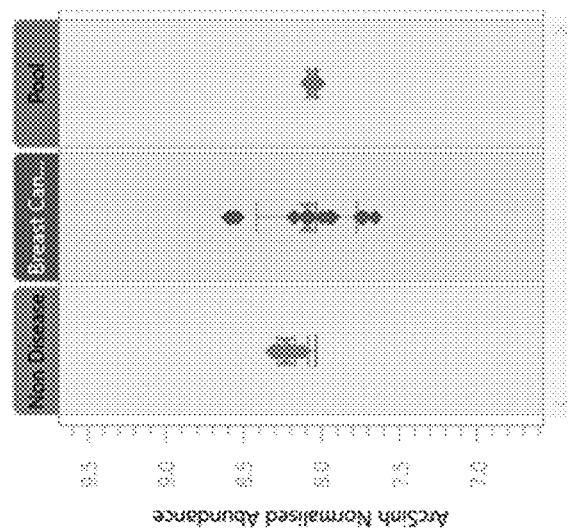
FIG. 8B is an abundance plot of aconitic acid comparing healthy urine sample, breast cancer positive urine sample, and pooled urine sample.
Figure 8A:
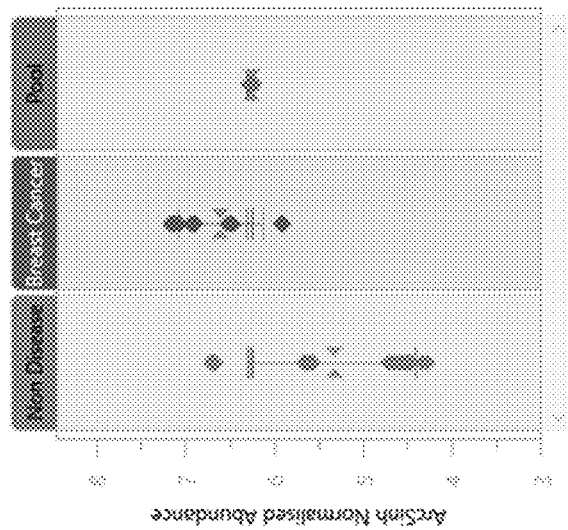
FIG. 8A is an abundance plot of succinic acid comparing healthy urine sample, breast cancer positive urine sample, and pooled urine sample.
Figure 8F:
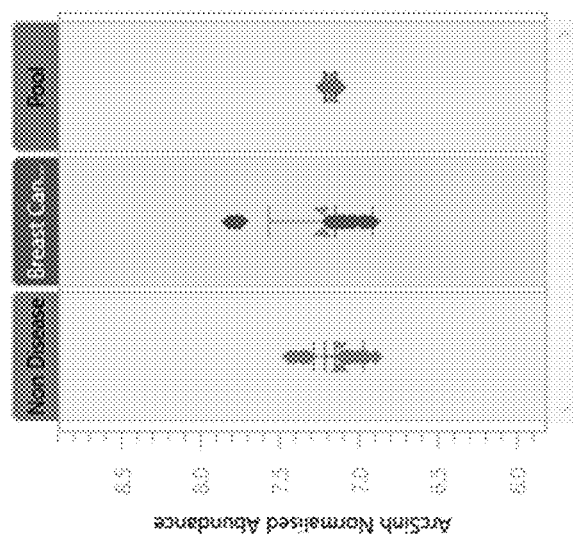
FIG. 8F is an abundance plot of 2-hydroxylglutaric acid comparing healthy urine sample, breast cancer positive urine sample, and pooled urine sample.
Figure 8E:
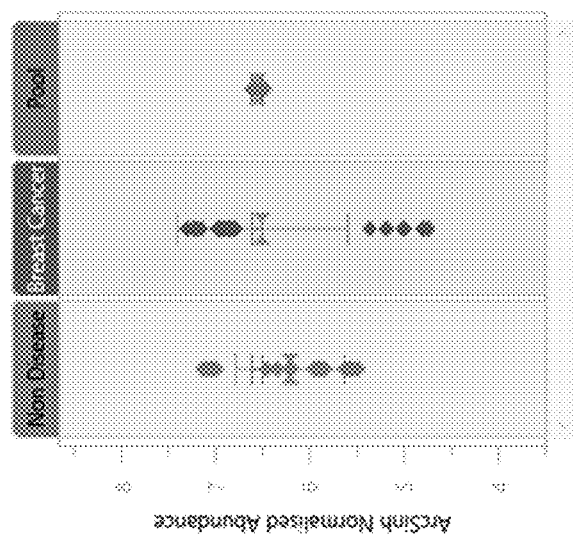
FIG. 8E is an abundance plot of 3-phosphoglyceric acid comparing healthy urine sample, breast cancer positive urine sample, and pooled urine sample.
Figure 8D:
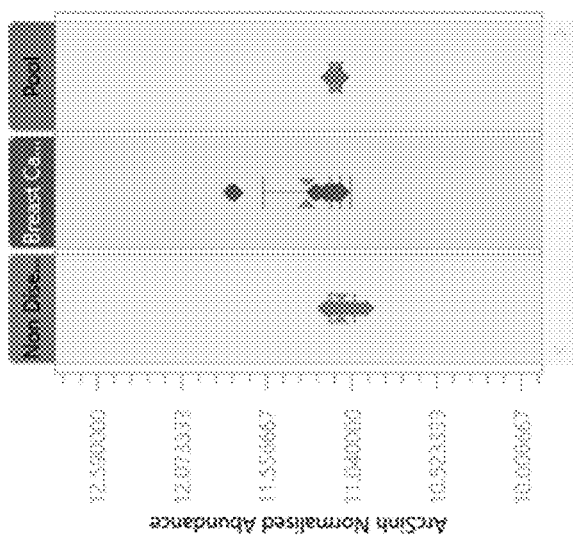
FIG. 8D is an abundance plot of citric acid comparing healthy urine sample, breast cancer positive urine sample, and pooled urine sample.

Separation of organic acids can be challenging due to their small and polar nature as well as the presence of many isobaric species. To ensure sample complexity would not hinder separation in matrix, aqueous standards as well as diluted urine sample spiked with the analytes to a final concentration of 100 μM were employed during method development. The separation of urinary metabolites was conducted on an ACQUITY PREMIER CSH Phenyl-Hexyl Column. FIG. 5A provides separation of the organic acids in the standard and FIG. 5B provides separation within the urine sample. The results shown in FIG. 5A and FIG. 5B illustrate the chromatographic separation power of utilizing the methods of the present technology (i.e., coated hardware, with phenyl-hexyl column). Each peak is resolvable. FIG. 5C provides a table identifying the peaks.

Selectivity in organic acid analysis in biological samples is important as many compounds are similar in structure or even isobaric. Chromatographic resolution of compounds with common fragments ensures confidence of measurement. Itaconic acid has two major identifying ions, $[M-H]^{-1}$ of 129.019 m/z and the fragment at 85.029 m/z. Isocitric acid, citric acid, cis-Aconitic acid, and 2-hydroxyglutaric acid also contain these two ions in their fragmentation patterns and are used for library matching. Confirming the presence of itaconic acid with any of these compounds co-elution would be difficult if not impossible. Isocitric and and citric acid are structural isomers with the molecular formula $C_6H_8O_7$. Although they each have some unique fragments, their absolute distinction or quantification cannot be guaranteed without chromatographic resolution. Similarly, succinic acid and methylmalonic acid are structural isomers, however their fragmentation is nearly identical, and requires chromatographic resolution for analysis. Malic acid and fumaric acid have different structures, however it has been shown that malic acid undergoes insource fragmentation and collision cell decomposition to contain same fragments as fumaric acid. Separation of these critical pairs was achieved using the methods of the current technology as shown in the standards of FIGS. 6A-6D. In FIG. 6A separation of critical pairs isocitric acid and citric acid is shown. In FIG. 6B separation of critical pair succinic acid and methylmalonic acid is achieved. In FIG. 6C separation of itaconic acid, cis-Aconitic acid, and 2-hydroxyglutaric acid is visible. And in FIG. 6D separation of critical pair malic acid from fumaric acid is shown.

Breast cancer positive samples versus non-diseased (or control) negative samples were evaluated using the following method. The sample set injection sequence was randomized, with each disease, control, and pool urine samples having 5 replicates. To ensure analytic performance, two system suitability samples were prepared. The first, a standard of all the analytes at a concentration of 100 μM in ultrapure water and a second at 100 μM final concentration spiked into a urine sample prepared as above. The two system suitability samples were run at the beginning and again at the end of the sample set.

The analytical method was applied to the comparative analysis of four individual samples of non-disease female urine as well as four breast cancer positive female urine samples. On dilution with water portions of each sample were injected with 5 replicates and randomized. The sample set was imported into Progenesis Q1 for featured processing.

Unsupervised PCA analysis shows separation of breast cancer positive and health control urine samples with distinct grouping for the two conditions. Tight clusters of replicate injections indicate excellent method reproducibility as shown in FIG. 7.

In FIG. 8, abundance plots of analytes showing their differences in healthy control versus diseased urine sample. These plots can be used to illustrate the abundance of different organic acids in healthy patients versus individuals with active breast cancer. Specifically, FIG. 8A shows abundance plots of succinic acid (healthy left plot, diseased center plot, and pool right plot). FIG. 8B shows abundance plots of aconitic acid (healthy left plot, diseased center plot, and pool right plot). FIG. 8C shows abundance plots of isocitric acid (healthy left plot, diseased center plot, and pool right plot). FIG. 8D shows abundance plots of citric acid (healthy left plot, diseased center plot, and pool right plot). FIG. 8E shows abundance plots of 3-phosphoglyceric acid (healthy left plot, diseased center plot, and pool right plot). And FIG. 8F shows abundance plots of 2-hydroxyglutaric acid (healthy left plot, diseased center plot, and pool right plot).

By utilizing the present technology to obtain well separated, reproducible results, that do not suffer from metal adducts, the data can be used to study the etiology of disease. The abundance plots of FIG. 8 provide data useful in the etiology of breast cancer.

What is claimed is:

1. A method of separating and analyzing a sample comprising:
    injecting the sample into a chromatographic system having a fluid-contacting coating on a metallic surface defining a sample flow path, wherein the coating comprises an alkylsilyl made using vapors of bis(trichlorosilyl)ethane or bis(trimethoxysilyl)ethane, and the sample comprises one or more tricarboxylic acid cycle metabolites;
    flowing the injected sample through the chromatographic system along the sample flow path;
    separating the flowing sample with the chromatographic system; and
    analyzing the separated sample with a mass spectrometer.

2. The method of claim 1, wherein the one or more tricarboxylic acid cycle metabolites comprise a carboxylic group.

3. The method of claim 1, wherein the one or more tricarboxylic acid cycle metabolites comprise at least one tricarboxylic acid metabolite selected from the group of citric acid, itaconic acid or 2-hydroxyglutaric acid.

4. The method of claim 1, wherein separating the sample comprises using a mixed mode anion exchange chromatographic method.

5. The method of claim 4, wherein using a mixed mode anion exchange chromatographic method comprises using a mobile phase of water and acetonitrile each containing formic acid.

6. The method of claim 4, wherein using a mixed mode anion exchange chromatographic method comprises using a phenyl-hexyl chromatographic column.

7. The method of claim 1, wherein the metallic surface comprises column walls and frit surfaces, and wherein the coating on the metallic surface increases metabolite peak area relative to a non-coated metallic surface.

8. A method of increasing resolution of a sample comprising one or more tricarboxylic acid cycle metabolites when using a chromatographic system, the method comprising:
    providing the chromatographic system having a fluid-contacting coating on a metallic surface defining a sample flow path, wherein the coating comprises an alkylsilyl made using vapors of bis(trichlorosilyl)ethane or bis(trimethoxysilyl)ethane;
    injecting the sample into the chromatographic system;
    flowing the injected sample through the chromatographic system along the sample flow path;
    separating the flowing sample with the chromatographic system; and
    passing the separated sample through a mass spectrometer to analyze the separated sample.

9. The method of claim 8, wherein selecting the alkylsilyl of the coating comprises assessing polarity of the sample; selecting a desired contact angle and coating material based on the polarity assessment; and adjusting hydrophobicity of the sample flow path by vapor deposition of alkylsilyl.

10. The method of claim 8, wherein the one or more tricarboxylic acid cycle metabolites comprise a carboxylic group.

11. The method of claim 8, wherein the one or more tricarboxylic acid cycle metabolites comprise at least one tricarboxylic acid metabolite selected from the group of citric acid, itaconic acid or 2-hydroxyglutaric acid.

12. The method of claim 8, wherein the metallic surface comprises column walls and frit surfaces, and wherein the coating on the metallic surface increases metabolite peak area relative to a non-coated metallic surface.

13. A method of studying etiology of a disease, the method comprising:
injecting the sample into a chromatographic system having a fluid-contacting coating on a metallic surface defining a sample flow path, wherein the coating comprises an alkylsilyl made using vapors of bis(trichlorosilyl)ethane or bis(trimethoxysilyl)ethane, and the sample comprises one or more tricarboxylic acid cycle metabolites;

flowing the injected sample through the chromatographic system along the sample flow path;

separating the flowing sample with the chromatographic system; and analyzing the separated sample with a mass spectrometer.

14. The method of claim 13, wherein the one or more tricarboxylic acid cycle metabolites comprise a carboxylic group.

15. The method of claim 13, wherein the one or more tricarboxylic acid cycle metabolites comprise at least one tricarboxylic acid cycle metabolite selected from the group of citric acid, itaconic acid or 2-hydroxyglutaric acid.

16. The method of claim 13, wherein the metallic surface comprises column walls and frit surfaces, and wherein the coating on the metallic surface increases metabolite peak area relative to a non-coated metallic surface.

17. The method of claim 13, wherein the coating covers at least 90% of the surfaces of the sample flow path.

* * * * *